(12) United States Patent
Hartman et al.

(10) Patent No.: US 6,249,155 B1
(45) Date of Patent: *Jun. 19, 2001

(54) FREQUENCY CORRECTION CIRCUIT FOR A PERIODIC SOURCE SUCH AS A CRYSTAL OSCILLATOR

(75) Inventors: Kenneth D. Hartman; David J. Kenny, both of DeKalb; Matthew J. Klueppel, Park Ridge, all of IL (US)

(73) Assignee: The Connor Winfield Corporation, Aurora, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/784,541

(22) Filed: Jan. 21, 1997

(51) Int. Cl.[7] ..................................... H03K 1/04
(52) U.S. Cl. .................. 327/106; 327/107; 327/147; 327/292; 327/299; 327/512
(58) Field of Search ................... 327/160, 107, 327/146, 147, 292, 299, 512; 331/1 R, 176

(56) References Cited

U.S. PATENT DOCUMENTS

| 5,216,389 | * | 6/1993 | Carralero et al. | 331/158 |
|---|---|---|---|---|
| 5,325,396 | | 6/1994 | Critchlow et al. | 375/8 |
| 5,495,206 | | 2/1996 | Hietala | 331/1 A |
| 5,497,126 | | 3/1996 | Kosiec et al. | 331/1 A |
| 5,497,399 | | 3/1996 | Ito | 375/271 |
| 5,508,659 | | 4/1996 | Brunet et al. | 331/16 |
| 5,521,532 | * | 5/1996 | Gumm | 331/4 |
| 5,552,749 | | 9/1996 | Nowatski et al. | 331/14 |
| 5,552,750 | | 9/1996 | Barrett, Jr. et al. | 331/25 |
| 5,557,244 | | 9/1996 | Salvi | 332/128 |
| 5,559,474 | | 9/1996 | Matsumoto et al. | 331/17 |
| 5,568,098 | | 10/1996 | Horie et al. | 331/16 |
| 5,570,066 | | 10/1996 | Eberhardt et al. | 331/34 |
| 5,572,168 | | 11/1996 | Kasturia | 331/2 |
| 5,576,644 | | 11/1996 | Pelella | 327/51 |
| 5,576,666 | * | 11/1996 | Rauvola | 331/16 |
| 5,686,864 | * | 11/1997 | Martin et al. | 327/159 |
| 5,742,208 | * | 4/1998 | Blazo | 327/156 |
| 5,748,047 | * | 5/1998 | Guthrie et al. | 331/176 |

OTHER PUBLICATIONS

*Digital Temperature Compensation Techniques for Crystal Oscillators* by Edward K. Miguel, CTS Knights Corporation, Proceedings, RF Technology Expo 87, Feb. 11–13, 1987, Anaheim, California, Cardiff Publishing Company. (pp13–22).

*A Temperature Compensated SC Cut Quartz Crystal Oscillator* by Edward K. Miguel, 36th Annual Frequency Control Symposium—1982. (pp576–585). Northern Illinois University, Dekalb, Ill.

(List continued on next page.)

*Primary Examiner*—Margaret R. Wambach
(74) *Attorney, Agent, or Firm*—Robert E. Bushnell, Esq.

(57) ABSTRACT

A frequency correction circuit includes a temperature sensor (100) disposed to measure temperature and produce temperature signals representing sensed temperatures. A data supplier (110) stores information items, receives digital input signals representing and produces a digital output information signal representing an item selected in accordance with the digital input signal. A control circuit (120) receives the temperature signals and receives the digital output information signal. The control circuit (120) produces control signals based on the temperature signals. A clock circuit (150) is disposed to generate a reference frequency signal. A digital synthesizer (130) receives the reference frequency signal and the control signals. The digital synthesizer produces an output frequency signal as directed by the control signals received from the control circuit (120).

45 Claims, 9 Drawing Sheets

OTHER PUBLICATIONS

"High–Speed DDS Synthesizer', Wireless Design & Development", *The Global Magazine of Commercial Wireless Technology*, Aug. 1996, vol. 4, No. 9.

"Generating DDS", "Microwaves & RF", Oct. 1993, Circle No. 195.

"CMOS Compete DDS", *Analog Devices*, Analog Devices, Inc., 1996, AD9830, 9831, 9850.

"Qualcomm Asis Products", *Synthesizer Products Data Book*, Qualcomm Incorporated, ASIC products, Nov. 1996.

* cited by examiner

FREQUENCY CORRECTION CIRCUIT FOR A PERIODIC SOURCE SUCH AS A CRYSTAL OSCILLATOR

BACKGROUND OF THE INVENTION

1. Field of the Invention

This invention relates generally to processes and electronic oscillating circuits, and, more particularly, to processes and oscillating circuits able to correct frequency variations in oscillating circuits caused by changes in temperature and other environmental conditions, and able to also correct frequency variations caused by environmental factors in non-crystal periodic sources.

2. Description of the Related Art

Oscillating circuits play a central and increasingly important role in digital and analog electronic systems. Digital devices require precise system timing, a function provided by oscillators and similar timing sources. Telecommunication and data transmission systems, which have analog and digital components, likewise rely on oscillators for modulation, demodulation, system clocking, and other functions.

A standard choice for a highly stable frequency source in such applications is a crystal-based oscillator or resonator. (Atomic frequency standards, while highly accurate, are undesirable in most such applications because of cost and packaging considerations.) While stable in comparison with non-crystal based resonating circuits, crystal oscillators and resonators nevertheless exhibit a degree of frequency instability owing to a crystal's inherent frequency response to temperature changes and to other environmentally influenced factors such as aging. See the paper titled Frequency-Temperature-Angle Characteristics of AT-Type Resonaters Made of Natural and Synthetic Quartz, Rudolf Bechmann, *Proceedings of the IRE*, November, 1956, pp. 1600–1607.

Current practice to correct such frequency instabilities follows two basic approaches. The first is represented by temperature compensated crystal oscillators (TCXOs) and digitally compensated crystal oscillators (DCXOs). In these designs, circuit elements sense the ambient temperature (which reflects the temperature of the crystal element) and the reactance loop of the oscillator circuit is adjusted to correct the frequency output. A DCXO differs from a TCXO primarily in the method employed to acquire temperature-related information used to compensate the oscillator circuit. A DCXO typically uses a temperature sensor, microprocessor and EPROM to acquire and store compensation data; a TCXO's compensation network uses analog devices solely, such as thermistors.

The second approach achieves frequency control by simply maintaining the oscillator's crystal element at a constant ambient temperature during operation, thus eliminating temperature as a cause of frequency variation. This approach is taken by the oven compensated crystal oscillator (OCXO). The relative success of these approaches varies. An OCXO can be manufactured which is significantly more accurate than a TCXO or DCXO. TCXO and DCXO oscillators are typically offered in the marketplace with accuracies from 5 ppm to 0.5 ppm. OCXO oscillators can be manufactured with accuracies from 0.5 ppm to 0.005 ppm. There is some overlap in accuracy between low end OCXOs and high end TCXOs and DCXOs. There are disadvantages with the OCXO relative to the TCXO and the DCXO, namely that it requires more power to operate, generates much waste heat, requires a substantial warn-up time, and occupies a bulky package. TCXO and DCXO oscillators have their own limitations, including relatively complex compensation networks (e.g., number of thermistors and other circuit elements to adjust the reactance loop) as well as the need to begin with a well-tuned, precise oscillator circuit and crystal element. These requirements make fabrication of TCXO and DCXO devices relatively elaborate and costly, although manufacture is generally less costly for TCXO and DCXO devices than for OCXOs.

Recent exemplars of contemporary practice include Watanabe et al. (U.S. Pat. No. 5,548,252, Digital Temperature Compensated Crystal Oscillator, Aug. 20, 1996). This oscillator uses a digital temperature compensated crystal oscillator (DTCXO) system with a memory that stores temperature compensation data received. Post et al. (U.S. Pat. No. 5,525,936, Temperature-Compensated Oscillated Circuit, Jun. 11, 1996), attempts to provide a temperature compensated oscillator circuit constructed with an oscillator controlled by a processor. The output frequency of the oscillator, or an external reference frequency, is used as a reference signal in conjunction with a dual mode oscillator that can be switched to provide temperature-dependent fundamental and third harmonic frequencies.

Connell et al. (U.S. Pat. No. 5,481,229, Low Power Temperature Compensated Crystal Oscillator, Jan. 2, 1996), shows a temperature compensated crystal oscillator constructed with a crystal oscillator circuit, a voltage controlled reactance element, a temperature compensation network, and a programmable DC-DC converter network having an output connected to the voltage controlled reactance element, or to the temperature compensation network, or both. Ishizaki et al. (U.S. Pat. No. 5,473,289, Temperature Compensated Crystal Oscillator, Dec. 5, 1995) has a temperature compensated crystal oscillator with an oscillation circuit, a temperature detecting circuit, and a control signal generating circuit, which is used as a reference frequency oscillator in a mobile communication device, such as a car telephone, a portable telephone, and a cordless telephone, a satellite communication device, and the like. Pucci et al. (U.S. Pat. No. 5,459,436, Temperature Compensated Crystal Oscillator With Disable, Oct. 17, 1995) discusses a temperature compensated crystal oscillator (TCXO) with a disable feature adapted to disable or enable temperature compensation The TCXO includes a crystal oscillator and a temperature compensation circuit.

Our study of contemporary practice leads us to conclude that contemporary practice fails to provide an oscillating circuit capable of effectively generating a periodic signal exhibiting a stable period in the presence of frequency fluctuations caused in the circuit by the effect of temperature changes and other changing environmental conditions such as crystal aging on the crystal element.

SUMMARY OF THE INVENTION

Accordingly, it is an object of the present invention to provide a circuit and process for improved frequency correction for an oscillating circuit.

It is another object to provide a circuit and process able to reduce frequency variation without adjustment to the circuit's reference clock.

It is yet another object to provide a circuit and process for correcting variations in clock frequency by adjusting a digitally synthesized output frequency.

It is still another object to provide a circuit and a process for generating a periodic signal exhibiting a stable period while using a low cost, low precision reference clock.

It is still yet another object to provide a circuit and process for generating an output frequency comparable in stability to that offered by an OCXO while using a low cost, low precision reference clock.

It is a further object to provide an oscillator circuit and process capable of achieving a level of frequency stability greater than that of a typical TCXO and DCXO, without the elaborate and finely tuned design required by a precise TCXO and DCXO, and which is easier and less costly to manufacture.

It is also an object to provide an improved digital synthesizing process and device for generating periodic frequencies with a stability and accuracy greater than exhibited by the reference clock driving the device.

It is a yet further object to provide an oscillator circuit and process capable of achieving a level of frequency stability comparable to that offered by a standard OCXO, without being burdened with the OCXO's disadvantages, including high power consumption, significant warm-up time, heat loss, a large package, and high manufacturing cost.

These and other objects are achieved through the use of a direct digital synthesizer (DDS) in a frequency correction circuit. The synthesizer generates a synthetic output frequency. It is driven by a reference clock and is therefore affected by the clock's frequency variations caused by temperature and other conditions. The output frequency of the synthesizer, however, can be controlled (and therefore adjusted) with a high degree of precision through a digital instruction programmed by a microcontroller or microprocessor. In response the direct digital synthesizer produces an output frequency as specified by the digital instruction. Using a direct digital synthesizer enables the frequency correction circuit to correct frequency variations continuously and very precisely. This permits adjustment of frequency for non-temperature environmental factors such as aging and acceleration, and is capable of compensating for frequency variations in non-crystal resonator periodic sources such as ceramic resonators or satellite-generated periodic sources.

There are two basic modes of operation of a device expressing a preferred embodiment of this invention: programming and operation. The purpose of programming is to evaluate the temperature-caused frequency variations experienced while running the device over its specified temperature range, and to generate frequency correction instructions to correct the variations, which instructions are then stored in a data storage area for future reference during normal operation of the device. There are two frequency sources in the device. One is a clock reference frequency which is required to clock the device's direct digital synthesizer and the device's digital microcontroller. The second is a frequency generated by the direct digital synthesizer. This is the "output frequency" which is adjusted by the frequency correction scheme of the present invention. No frequency compensation of the reference clock is attempted.

The device is programmed during the manufacturing process. The device is operated in a test oven at temperatures sequenced by one-half of a degree or other temperature division throughout the specified temperature range of the device. A temperature sensor senses the device temperature at each temperature point. The temperature is encoded as binary data and is accessed by a programming computer either directly or through a microcontroller in the device.

At each temperature point the programming computer reads the actual output frequency of a direct digital synthesizer (DDS) via a frequency counter and compares it with the target output frequency. When there is a discrepancy between actual and target output frequencies, the programming computer derives a frequency correction instruction which it issues to the direct digital synthesizer. The synthesizer responds by adjusting its output frequency as specified in the instruction. The programming computer continues to read the output frequency of the direct digital synthesizer at regular intervals at the given temperature point and continues to issue frequency correction instructions until the output frequency of the synthesizer matches the target output frequency. Then the programming computer stores the temperature data and the last frequency correction instruction in the data storage area (EEPROM). The measured temperature data serves as an index to the frequency correction instruction for later reference during normal operation of the device.

When the frequency correction instruction has been stored for a given temperature point, the oven temperature is changed to the next temperature point in the sequence. The process of reading the output frequency of the synthesizer, generating a frequency correction instruction, and storing the last instruction in the data storage device, is repeated for each temperature point in the specified temperature range of the device. Programming is completed when frequency correction instructions have been stored for each temperature point in the specified range. Thus, when the device is programmed, frequency correction instructions exist for each temperature point within the specified operating temperature range of the device.

In the operating mode, the temperature sensor senses the ambient temperature which is periodically read by the device's microcontroller. The microcontroller reads the frequency correction instruction corresponding to the ambient temperature from the lookup table in the EEPROM and issues that instruction to the synthesizer. The synthesizer produces the output frequency specified by the instruction. The process of temperature monitoring and adjustment of the output frequency from the synthesizer is repeated at regular intervals, e.g., each quarter of a second, while the device is operating. In this manner the output frequency is continuously adjusted. As noted, the reference clock's frequency is not adjusted.

BRIEF DESCRIPTION OF THE DRAWINGS

A more complete appreciation of the invention, and many of the attendant advantages thereof, will be readily apparent as the invention becomes better understood by reference to the following detailed description, when considered in conjunction with the accompanying drawings in which like reference symbols indicate the same or similar components, wherein.

DETAILED DESCRIPTION OF THE PREFERRED EMBODIMENTS

Figure 1:
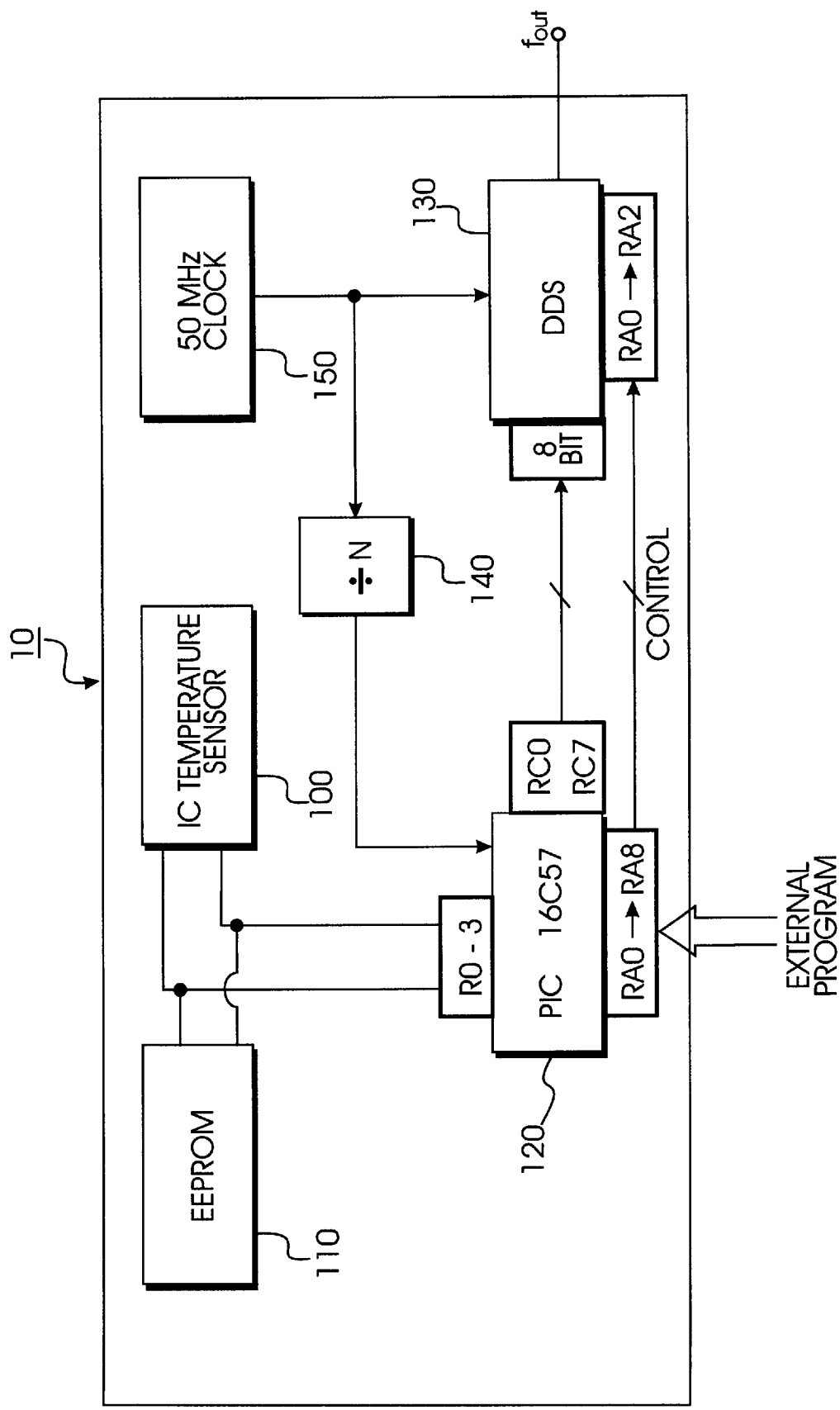
FIG. 1 is a block diagram illustrating a preferred embodiment of the present invention.

Turning now to the drawings, FIG. 1 shows a block diagram of a discrete oscillating circuit component device 10 constructed as a preferred embodiment of the invention. Each of the component elements of that preferred embodiment is identified further in FIG. 2. The programming and operating modes of the identified preferred embodiment are explained in detail immediately below, Oscillating circuit 10 includes a microcontroller 120, an integrated circuit (IC) temperature sensor 100 sending information about ambient temperature to microcontroller 120, a clock 150 sending a clock signal $f_{CLK}$ to microcontroller 120 via a divide-by-N clock signal divider 140, and a direct digital synthesizer (DDS) 130 separately receiving control and frequency information directly from microcontroller 120 and receiving a clock signal $f_{CLK}$ from the clock 150. The direct digital synthesizer 130 generates an output frequency $f_{out}$.

A direct digital synthesizer (DDS) is a numerically controlled oscillator using a phase accumulator, sine wave look-up table and multi-bit digital-to-analog converter to generate an analog periodic signal from a reference clock frequency $f_{CLK}$ externally applied to the synthesizer by clock 150, with digital logic applied to synthesizer 130 by microcontroller 120 selectively controlling the frequency, phase, and amplitude of oscillation of that periodic signal. An oscillator using a synthesizer may offer several advantages over analog-based oscillators and phase-locked loops PLLs). For example, an oscillator using a synthesizer may offer better resolution and little or low settling time. Some commercially available direct digital synthesizers claim to provide frequency accuracy that can be controlled to one part in four million. The resolution of an oscillator using a direct digital synthesizer is the output frequency divided by the number of accumulator bits:

$$\text{Frequency Resolution} = \frac{f_{CLK}}{2^N}$$

where $f_{CLK}$ is the frequency of clock 150, and N is the number of phase accumulator bits within the direct digital synthesizer 130. A higher number of accumulator bits allows better resolution. The settling time of such an oscillator can be near zero. This allows rapid, phase-coherent, and phase-continuous frequency shifting. Currently, the output frequency of direct digital synthesizer systems is typically limited, as a rule of thumb to avoid aliasing, to between one-third and one-half of the maximum clock frequency $f_{CLK}$; this is due to harmonic and spurious content present in the output signal. Higher output frequencies $f_{out}$ may be obtained by using aliased-imaging techniques that take advantage of the fact that direct digital synthesis image responses are automatically generated at:

$$(M \cdot f_{CLK}) \pm f \qquad (2)$$

where M=1, 2, 3 . . . or other whole number integer.

Figure 6:
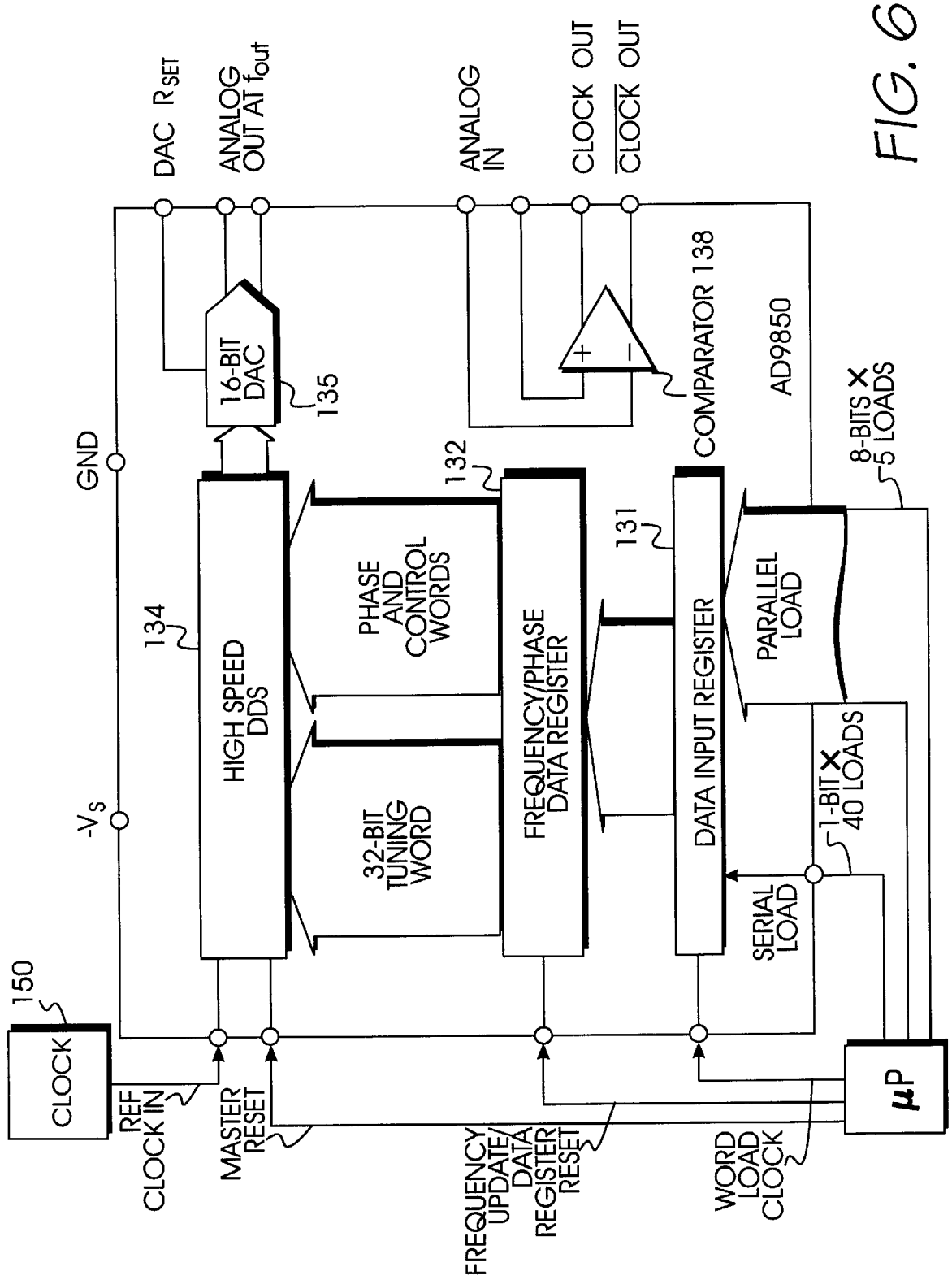
FIG. 6 is a functional block diagram of a direct digital synthesizer of a preferred embodiment of the present invention.

These direct digital synthesizer systems often use a read-only memory (ROM) within the direct digital synthesis block DDS 134 shown in FIG. 6, to store the values of a sine wave. These values are then read at regular intervals (using an accumulator to generate the ROM address) and converted into analog signals by a digital-to-analog converter (DAC) 135. The relation between the output frequency $f_{out}$, the reference clock frequency $f_{CLK}$, and the tuning word is determined by:

$$f_{out} = \frac{\Delta \text{Phase} \times f_{CLK}}{2^N}$$

where $\Delta$ Phase is the value of a thirty-two bit tuning word. The digital sine wave generated by the DDS block 134 of direct digital synthesizer 130 drives the internal high speed analog-to-digital converter 135.

In essence, a direct digital synthesizer is a digital frequency divider providing an incremental resolution that is, under contemporary practice, determined by the frequency of the reference clock $f_{CLK}$, divided by two raised to the number of bits of the tuning word. The phase accumulator of the synthesizer is a variable-modulus counter that increments the number stored in the accumulator each time that the synthesizer receives a reference clock pulse $f_{CLK}$ from clock 150. When the variable-modulus counter overflows, it wraps around so as to make the output of the phase accumulator contiguous. The frequency tuning word sets the modulus of the counter, thereby effectively determining the size of each increment, $\Delta$ Phase, that is added to the value stored in the accumulator on the next reference clock pulse $f_{CLK}$. The larger the added increment, the faster the accumulator overflows, thereby generating a higher output frequency $f_{out}$. Direct digital synthesizers are inherently agile, that is, able to switch between selected frequencies output frequencies $f_{out}$ quickly in response to a change in the tuning word, at rates according to one source, on the order of nanoseconds or a few microseconds.

Accumulator performance is sometimes optimized by using a pipeline approach. For instance, when using a thirty-two bit direct digital synthesizer, instead of adding a full thirty-two bit word at each clock cycle, the word can be split into 16 two-bit segments, with a flip-flop between each segment to store the previous cycle's carry. This method permits thirty-two bit accumulators to operate at frequencies as high as one giga-Hertz. Thus, direct digital synthesizer 130 permits higher-speed applications than do other types of frequency synthesizers. For example, when manufactured together with gallium arsenide (GaAs) transistors, a direct digital synthesizer permits application-specific integrated circuits (ASICs) of high-speed applications. Hence, direct digital synthesizers (DDS) of various capabilities exist and many of these direct digital synthesizers are suitable for use in the construction of the present invention. Although direct digital synthesizers are designed to provide rapid frequency re-tuning, we have found that contemporary designs for synthesizers such as these direct digital synthesizers maintain that the reconstructed analog output from the digital-to-analog converter retains the same frequency stability and accuracy as the applied clock reference $f_{CLK}$. In other words, frequency variations in the reference clock are reflected in the direct digital synthesizer's output frequency stability.

Alternative embodiments exist, which utilize different methods to accomplish each function of oscillating circuit 10 described in FIG. 1. Integrated circuit (IC) temperature sensor 100 can be a National LM75 temperature sensor for example. The temperature sensor 100 has three leads to a 5-volt potential and one lead to another 5-volt potential. The temperature sensor 100 has another lead connected to a reference potential such as a local circuit ground. The two leads (SDA and SCL) of the sensor are connected to the microcontroller 120.

In another embodiment, a non-IC semiconductor temperature sensor can be used instead of the IC temperature sensor. The non-IC semiconductor temperature sensor may be connected by either software or hardware to the microcontroller and EEPROM in a manner analogous to the connection of the IC temperature sensor.

Figure 2:
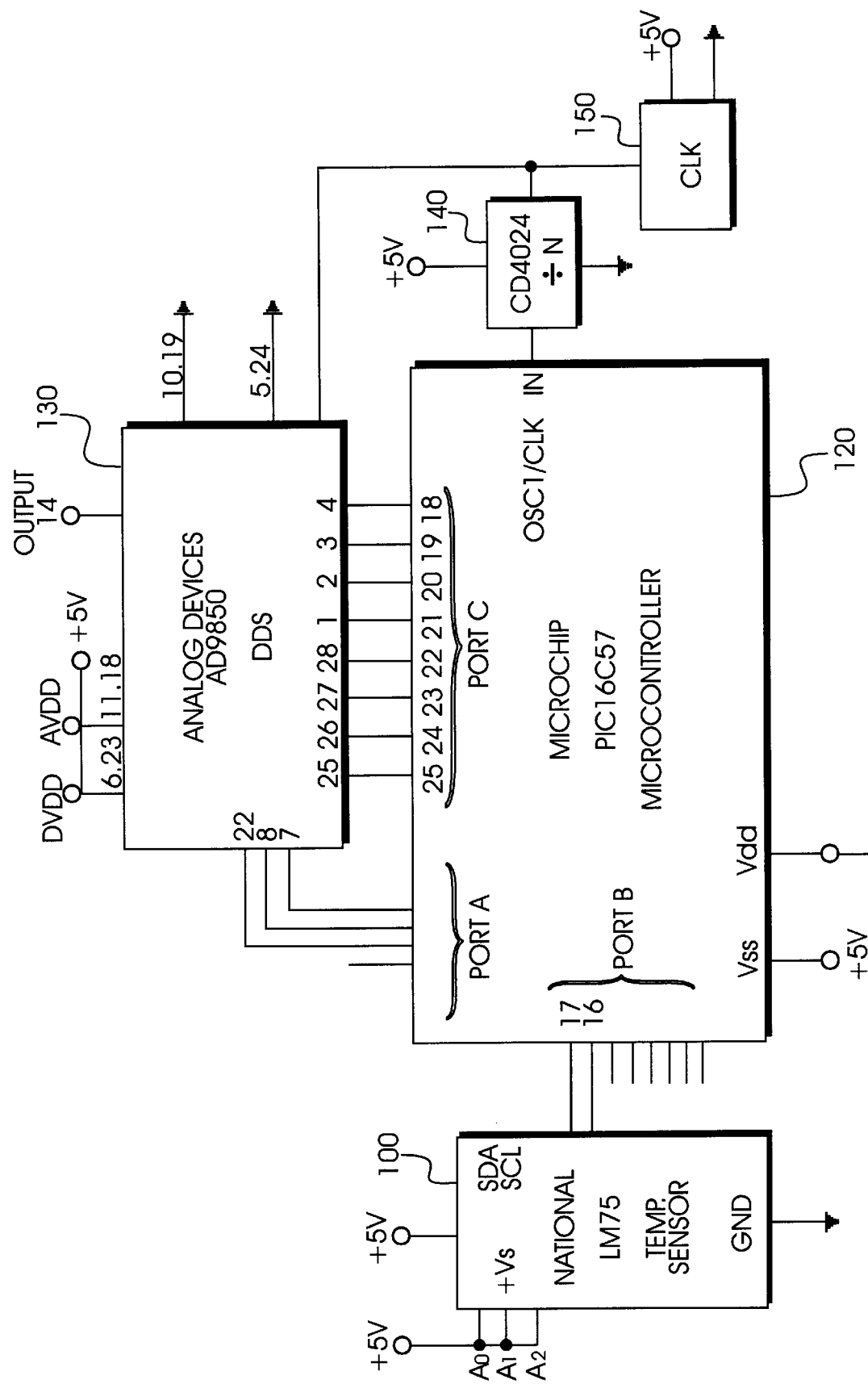
FIG. 2 is a detailed parts diagram depicting several component features of a preferred embodiment of the present invention.

As shown in FIG. 2, the microcontroller 120 can be a PIC 16C57 microchip. The microcontroller 120 has two pins (pins 16 and 17 of port B) that are connected to two leads of the temperature sensor 100. SDA is connected to pin 17, and SCL is connected to pin 16. In addition to port B, the microcontroller 120 has a port A and a port C. Some of pins of the port A connect to the direct digital synthesizer 130. All pins of the port C (eight pins: 18, 19, 20, 21, 22, 23, 24, and 25) are connected to the direct digital synthesizer 130. The microcontroller 130 also receives clock signals from the clock 150, via the divide-by-N clock divider 140. A Vss voltage of the microcontroller 120 is connected to a potential of 5 volts. Divide-by-N divider may be a CD4024 divider. A Vdd voltage of the microcontroller 120 is connected to the reference potential such as a local ground.

Programming Mode

The preferred embodiment described in detail above used an Analog Devices AD9850 direct digital synthesizer (DDS). The AD9850 is available in a 28-lead SSOP that is operational up to 85 degrees Celsius. The direct digital synthesizer (DDS) 130 has eight pins that are connected to the port C of the microcontroller 120; pins 25, 26, 27, 28, 1, 2, 3, 4 of the DDS 130 are respectively connected to pins 25, 24, 23, 22, 21, 20, 19, 18 of the port C of the microcontroller 120. Pins 22, 8, and 7 ofthe DDS 130 are connected to the port A of the microcontroller 120. Pins 10 and 19 of the DDS 130 are connected to one of two grounds. Pins 5 and 24 of the DDS 130 are connected to the other of the two grounds. Pins 6 and 23 of the direct digital synthesizer 130 are connected to DVDD (the digital voltage). Pins 11 and 18 of the DDS 130 are connected to AVDD (the analog voltage). DVDD and AVDD are connected to a 5-volt potential. Pin 14 of the DDS 130 is an output pin for the direct digital synthesizer 130.

Figure 3:
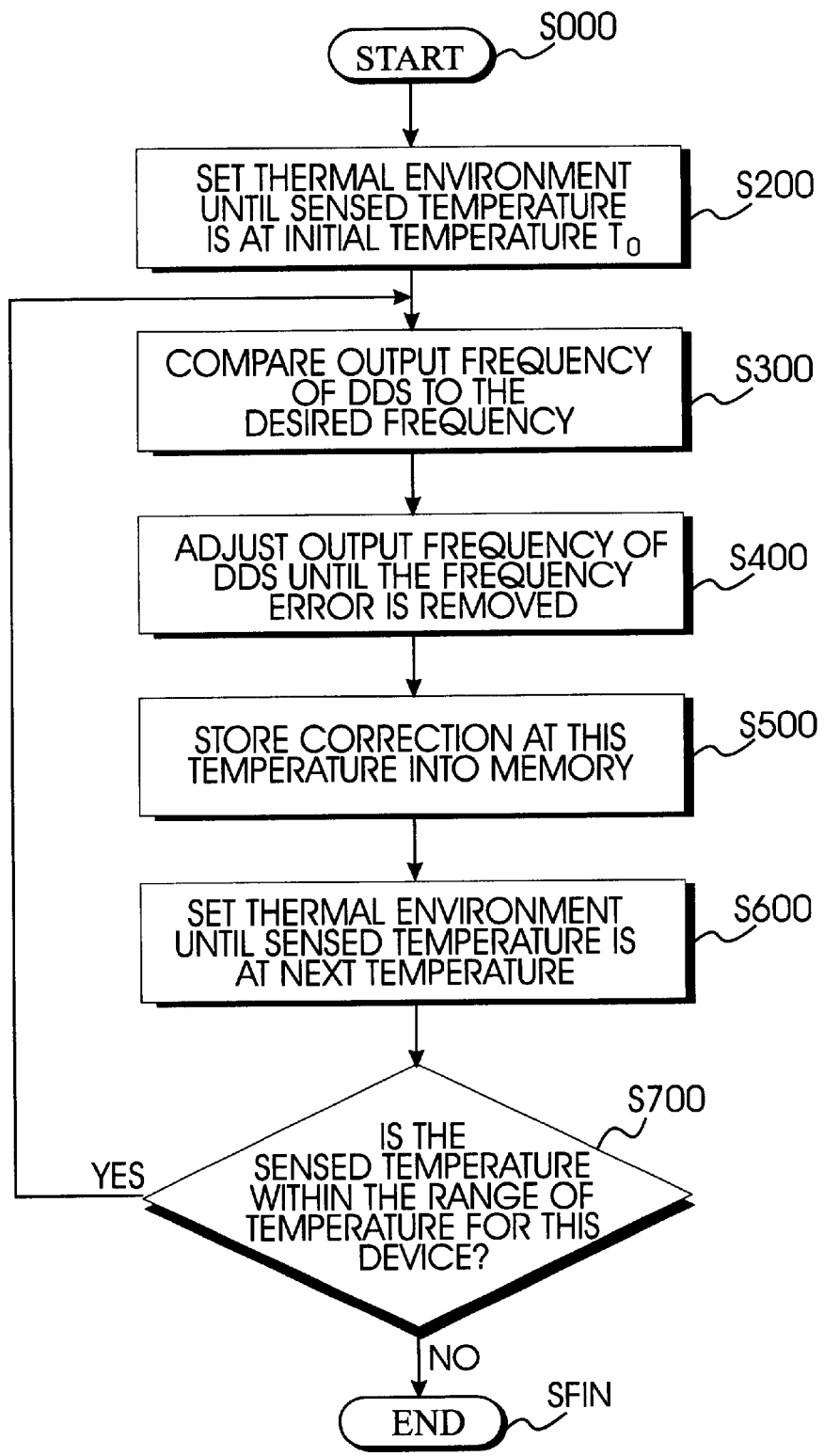
FIG. 3 is a flow chart of the process of programming or initializing the values of a lookup table according to a preferred embodiment of the present invention.
Figure 9:
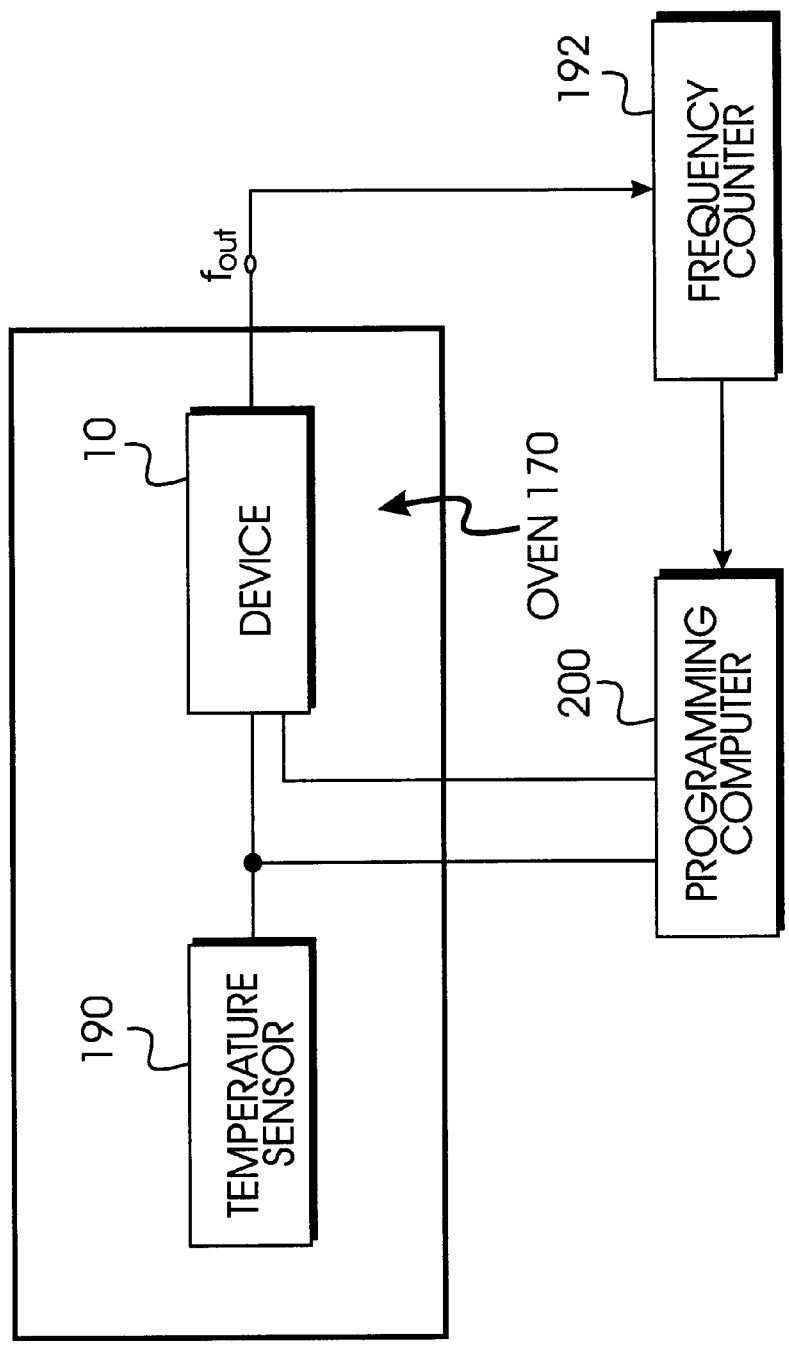
FIG. 9 is a functional block diagram depicting an oven environment used during programming of a preferred embodiment of the present invention.

A flow chart of the programming steps is shown in FIG. 3, using the programming set-up shown in FIG. 9, and the ensuing discussion details the steps of the programming mode referenced to FIG. 3. The purpose of programming is to evaluate the temperature-caused frequency variations experienced while running the device 10 across its specified temperature range, to generate frequency correction instructions for each temperature point within the specified operating range of device 10, and to store the instructions in a data storage area of memory 110 for future reference during normal operation of the device. The frequency correction instructions for each temperature point are then used during normal operation to issue a frequency correction instruction to the direct digital synthesizer for each temperature experienced by the device. There are two frequency sources in the device. One is a clock 150 that generates the reference frequency which is required to clock the device's direct digital synthesizer 130 and the device's digital microcontroller 120. The second source is direct digital synthesizer 130 that generates the output frequency $f_{out}$. This output frequency $f_{out}$ is adjusted by the frequency correction scheme during the practice of the present invention. The reference clock frequency $f_{CLK}$ 150 is not adjusted.

Set Thermal Environment and Sense Temperature

During programming, in step S200 device 10 is operated in a test oven 170 at temperatures sequenced by perhaps, one-half of a degree or other temperature division throughout the specified temperature range of the device. Integrated circuit (IC) temperature sensor 100 senses the oven temperature at each temperature point. Alternatively, a different temperature sensor 190, as shown in FIG. 9, may be used as a part of a programming fixture, to sense the device temperature at each temperature point. The temperature is encoded as binary data of one to four bits and is read by microcontroller 120 as the input bits (specifically at ports RB0, RB1, RB2, and RB3). The programming computer 200 accesses the temperature information through output ports of microcontroller 120. Programming computer 200 determines that the temperature is stable through a method of receiving a specified number of successive reports of identical temperature from temperature sensor 100 (or alternatively, from sensor 190).

Compare Output Frequency of DDS to Desired Frequency

As is indicated in step S300, at each temperature point the programming computer reads the actual output frequency $f_{out}$ from direct digital synthesizer 130 via a frequency counter 192 and compares the actual output frequency $f_{out}$ with the target output frequency contained in the programming computer's program. When there is a discrepancy between the actual and the target output frequencies, the programming computer 200 derives a frequency correction instruction which it issues to direct digital synthesizer 130 using input ports of microcontroller 120 and input ports of direct digital synthesizer 130. Both the direct digital synthesizer 130 and the microcontroller 120 require a fixed reference frequency from a clock 150. Divide by N frequency divider 140 can be used because typically microcontroller 120 runs at a clock speed significantly lower than the clock speed of direct digital synthesizer 130. Direct digital synthesizer 130 requires a specific output frequency instruction from microcontroller 120. The control program of programming computer 200 is designed to alter the actual output frequency $f_{out}$ of direct digital synthesizer 130 in increments measured in parts per million (ppm), based upon the amount of measured discrepancy between the actual output frequency of the direct digital synthesizer and the target frequency. The resolution of the direct digital synthesizer used in this particular embodiment, manufactured by Analog Devices AD9850, has an output frequency resolution determined by the formula:

$$\text{The reference clock's frequency}/2^{32} \qquad (4)$$

Thus, for a reference clock frequency of fifty mega-Hertz, direct digital synthesizer 130 could be programmed to change its output frequency in increments as small as 50 MHz/$2^{32}$, or 0.01 Hz per bit change. The programming computer's control program could specify that the output frequency of direct digital synthesizer 130 would move more in ppm for a greater discrepancy and less for a smaller discrepancy (as limited by the resolution). The programming computer would then issue an instruction to direct digital synthesizer 130 to move to that output frequency $f_{out}$.

Adjust Frequency of DDS Until Frequency Error is Removed

At step S400, the direct digital synthesizer 130 responds to the frequency correction instruction issued to it by programming computer 200 by adjusting its output frequency to the frequency specified in the frequency correction instruction. Programming computer 200 continues to read the output frequency fault of direct digital synthesizer 130 at regular intervals at the given temperature point and continues to issue frequency correction instructions until the output frequency of direct digital synthesizer 130 matches the target output frequency.

Store Frequency Correction Instruction At This Temperature Into Memory

When a final frequency correction instruction is derived, at step S500 the programming computer stores that specific frequency correction instruction as well as the data identifying the temperature point in the data storage area (EEPROM) 110. The temperature point data serves as an index to the frequency correction instruction corresponding to that temperature for later reference during normal operation of the device.

Set Thermal Environment to Next Temperature

When the frequency correction instruction has been stored for a given temperature point, in step S600 the oven temperature is changed to the next temperature point in the sequence. The process of reading the output frequency $f_{out}$ generated by direct digital synthesizer 130, then generating a frequency correction instruction, and then storing the last instruction in the data storage device, is repeated for each temperature point in the specified temperature range of the device. Programming is completed when frequency correction instructions (i.e., each of the digital tuning words) have been stored for each temperature point in the specified range. Thus, when the device is programmed, a frequency correction instruction exists for each temperature point within the specified operating temperature range of the device. Note that at no time is the frequency of the reference clock signal $f_{CLK}$ generated by clock 150 corrected.

Operating Mode

When the device is operated in the operating mode, the temperature sensor senses the ambient temperature and makes it available to be periodically read by the device's microcontroller. The microcontroller fetches that temperature's frequency correction instruction from the lookup table in the EEPROM and issues that instruction (i.e., a digital tuning word) to the direct digital synthesizer 130. Direct digital synthesizer 130 produces the output frequency specified by the instruction. The process of temperature monitoring and adjustment of the output frequency of direct digital synthesizer 130 is repeated at regular intervals, e.g., each quarter second, while the device is operating. In this manner the output frequency may be continuously adjusted. As noted, the frequency $f_{CLK}$ of reference clock 150 is not adjusted.

Figure 4:
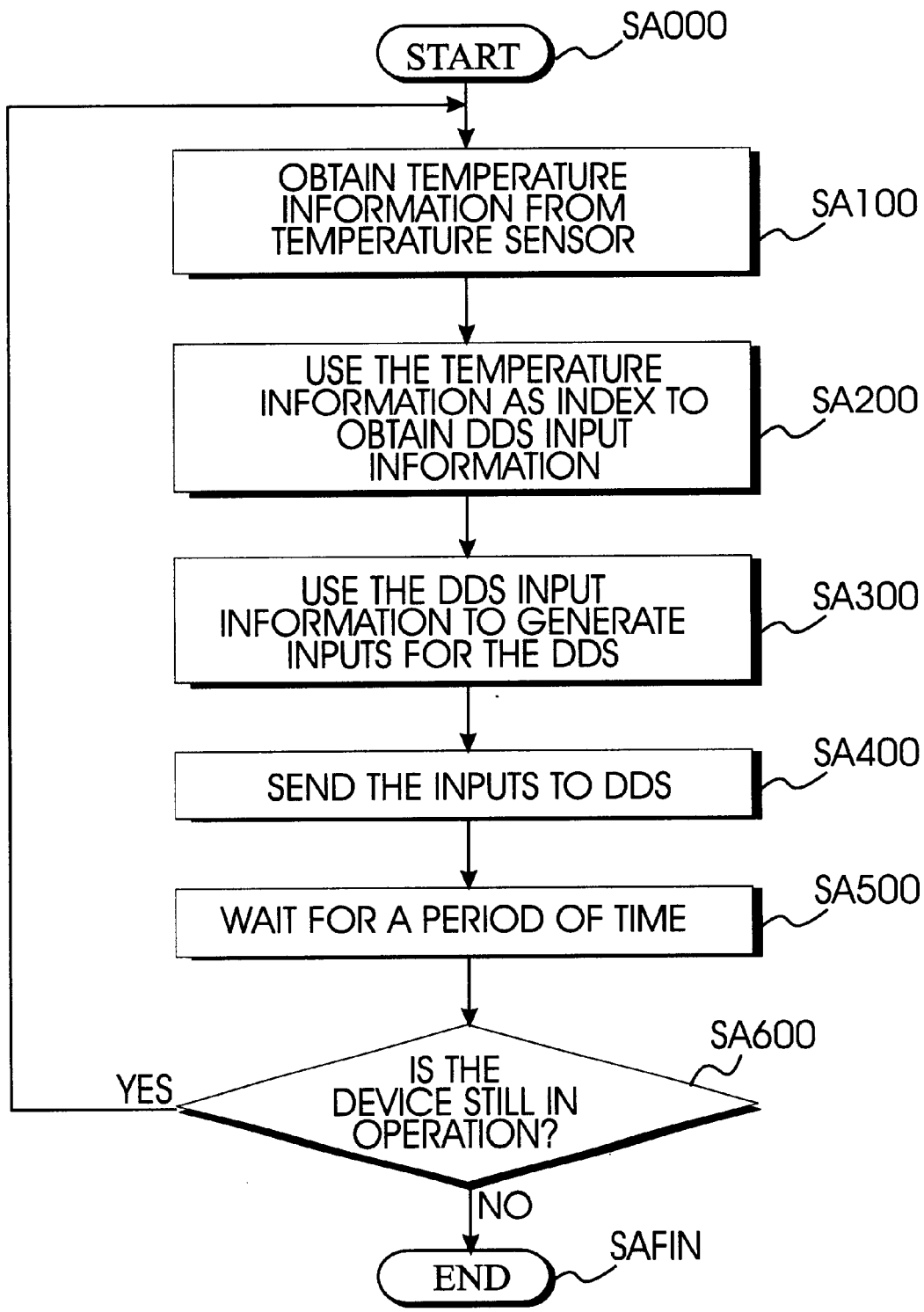
FIG. 4 is a flow chart of operation of a preferred embodiment of the present invention.

FIG. 4 shows a flow chart of the operating mode of the device. During the operating mode, in step SA 100 the temperature sensor 100 sends data on temperature to the microcontroller 120. The microcontroller 120 in step SA 200 then accesses the EEPROM 110 for frequency correction instruction indexed to the sensed temperature. In step SA 300 microcontroller 120 then writes the frequency correction data as a program or instruction to the direct digital synthesizer (DDS) 130. Note that the output frequency $f_{out}$ of synthesizer 130 is not monitored during the operating mode. Subsequently, in step SA 400, direct digital synthesizer 130 then adjusts its output frequency in accordance with the frequency correction instruction. In response to reception of the frequency correction code in step SA 400, the direct digital synthesizer 130 generates a sine wave which can be used directly as a frequency source or be converted by direct digital synthesizer 130 into a square wave. After correction, in step SA 500, the circuit pauses, then repeats the iteration beginning with step SA100 after determining in step SA 600 that the device is still in operation.

It should be noted that both the microcontroller 120 and the direct digital synthesizer 130 require a reference frequency $f_{CLK}$ to operate, which is provided by an clock oscillator 150. Since the microcontroller typically has a lower run rate than the direct digital synthesizer, divide down by-N divider 140 is used to produce a suitable frequency to the microcontroller. The aim of the programming process is to measure and correct for the frequency effect that each temperature change has on the direct digital synthesizer both directly and also indirectly through each temperature change's frequency effect on the clock oscillator 150. Frequency correction can be accomplished, however, irrespective of the amount of deviation in the frequency of reference frequency $f_{CLK}$ by clock oscillator 150. Consequently, a high precision clock reference is unnecessary for the frequency correction scheme embodied in the present invention. A low precision reference clock 150 performs its function equally as well.

Proof of Concept

Figure 5:
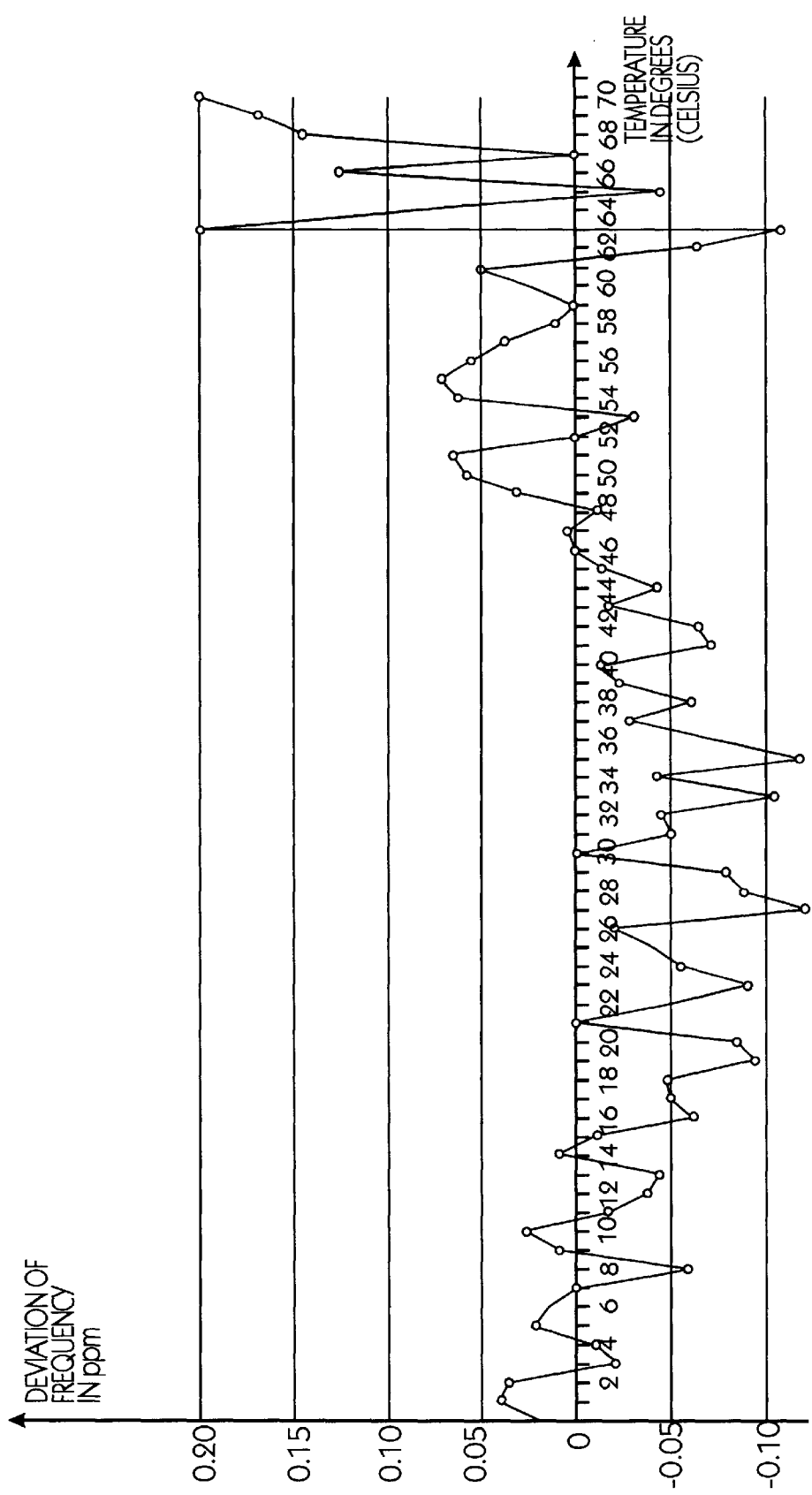
FIG. 5 is a two coordinate graph showing measurements of deviation in output frequency during operation of a prototype constructed according to the principles of the present invention.

FIG. 5 is a graph of the frequency control performance of a preferred embodiment of the present invention. The circuit utilized a standard 100 ppm reference clock, a Qualcom Q2334DDS development kit, a Dallas 1620 temperature sensor, and a computer serving as the controller. The device was programmed over a 0° to 70° degree Celsius range at one half degree intervals. The results showed a maximum deviation of 0.2 ppm over the temperature range, a result comparable to that attainable by a low end OCXO, and significantly tighter than standard TCXO's and DCXO's.

Alternative Embodiments

In another preferred embodiment an integrated circuit (IC) temperature sensor could send information in analog form to a microcontroller via an analog-to-digital converter which converts the signal into digital form. This approach permits a high degree of precision temperature measurement and signaling.

The preferred embodiments described above utilized a lookup table. Other embodiments of the present invention may be constructed that do not use lookup tables. An alternative embodiment can use an algorithm rather than a lookup table. For example, Bechmann's normalized curves show frequency—temperature relationships of various cuts of crystals. See Bechmann, op. cit., pp. 1600–1607. An algorithm can be constructed using only a few points of data for an identified crystal cut. The algorithm is then stored in the EEPROM or microcontroller for later use to correct frequency variations during the device's normal operation. The advantage offered by an algorithm is that less data would have to be developed during the programming mode of the device. The cubic (or other) curve described by the algorithm would dictate the frequency correction information.

In another alternative embodiment, mathematical transformations performed by microprocessor 120 on the temperature information read from sensor 100 are permitted as an alternative to lookup tables. By using sets of equations which approximate the relationship between actual and corrected frequencies, a mathematical transformation based on these sets of equations can be used to determine frequency correction information. Thus, lookup tables are only one way of accomplishing the frequency correction embodied in the present invention.

Figure 8:
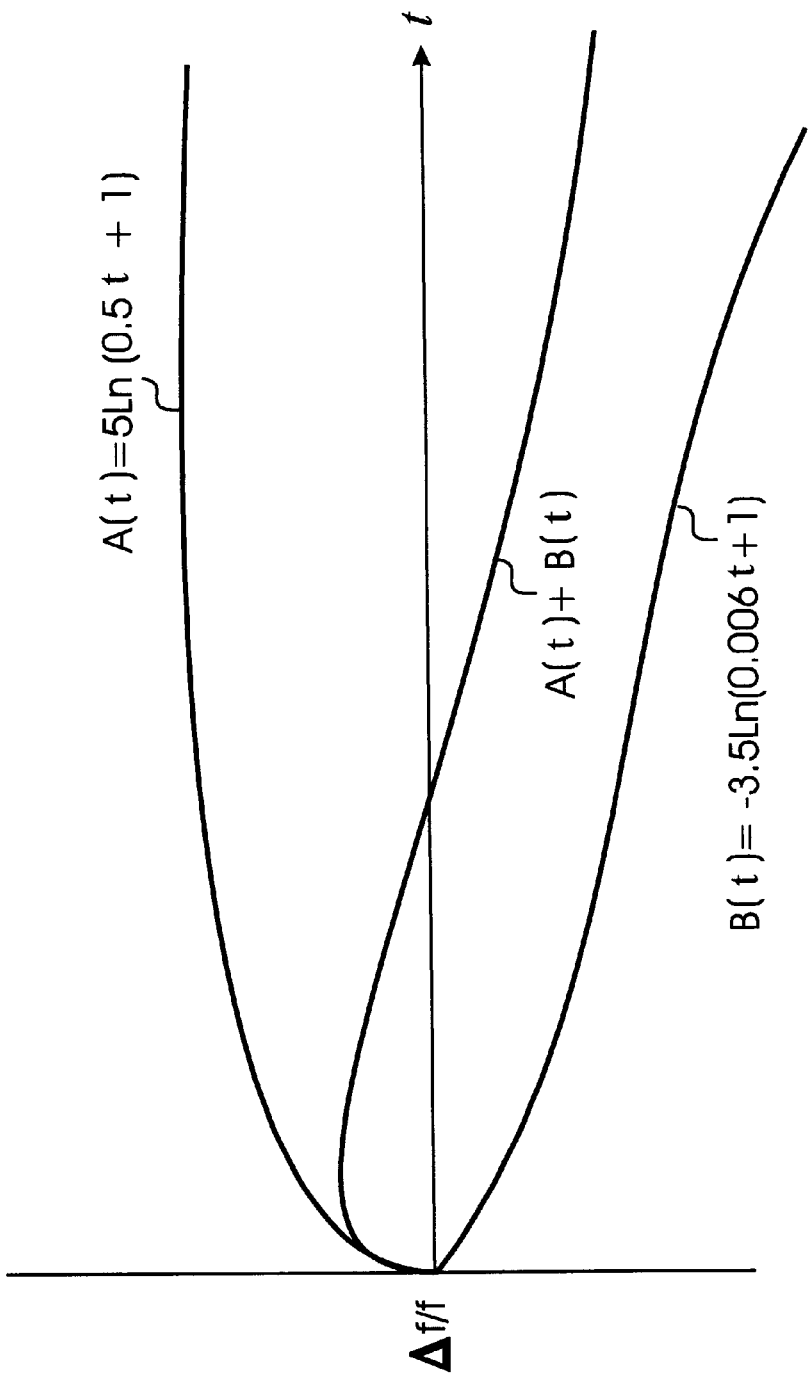
FIG. 8 is a two coordinate graph illustrating examples of changes in frequency deviation attributable to crystal aging.

Frequency correction information also need not be restricted to temperature—frequency relationships. Referring now to the two coordinate graph presented in FIG. 8, other characteristics of deviations in the frequency of crystal data could be used in conjunction with temperature data. For example, other influences affecting frequency stability could be used such as data on crystal aging and acceleration forces. FIG. 8 shows two plots of deviations in frequency, $\Delta f/f_{CLK}$, as a function of time, that is deviations in clock frequency $f_{CLK}$ attributable to the age of the crystal incorporated into clock 150. Crystal aging can occur through various factors. Each factor can shift frequency stability in either a positive A(t) direction:

$$A(t)=5Ln(0.5t+1) \qquad (5)$$

or a negative B(t) direction:

$$B(t)=-3.5Ln(0.006t+1) \qquad (6)$$

The combination of these positive and negative shifts, described by the intermediate plot, $$A(t)+B(t), \qquad (7)$$

can lead to an eventual reversal of direction in the shift in deviation (e.g. a shift in the positive direction for a period of time, followed by a subsequent shift in the negative direction). To implement frequency correction of $f_{out}$ due to deviation in frequency exhibited by $f_{CLK}$ attributable to non-temperature data (such as crystal aging, acceleration forces, and other parameters affecting the accuracy or stability of the clock circuit), microprocessor 120 can use the previously discussed lookup tables, or algorithms, mathematical transforms, or any other suitable technique. If a lookup table is used, the non-temperature data would be indexed in the same fashion in the lookup table as temperature data, albeit as a function of time. Thus, the technology of the present invention is applicable to correction of frequency deviation attributable to causes other than thermal ambient thermal variations.

In another alternative embodiment, a microprocessor or microcomputer may be used instead of the microcontroller 120 identified in FIG. 1. The microprocessor or microcomputer could be connected to the EEPROM 110, direct digital synthesizer 130, and reference clock 150, in a fashion analogous to the connection of the microcontroller 120 in FIG. 1. Alternatively, the microprocessor could utilize memory inside the processor to store either a table of digital tuning words indexed by incrementally different temperatures extending across the operating range of device 10 or to store an algorithm for converting any ambient temperature read from sensor 100 within the operating range into a digital tuning word, without relying upon a discrete external memory such as EEPROM 110. In addition, different microcontrollers or microprocessors and microcomputers could be used. And different reference clocks producing differing frequencies could be used in alternative preferred embodiments.

The clock reference signal in the preferred embodiment described herein is a crystal oscillator. In other embodiments, a non-crystal device such as an inductive-capacitance oscillating network could be used. Any periodic source can be utilized to supply the clock reference frequency to the microcontroller and direct digital synthesizer.

Referring now to FIG. 6, when direct digital synthesizer 130 is referenced to a clock source, it generates a frequency programmable, analog output sine wave having the selected output frequency $f_{out}$ at the ANALOG OUT ports of synthesizer 130. This sine wave can be directly used as a frequency source, or be converted into a square wave by comparator 139 by coupling the ANALOG OUT ports to the ANALOG IN ports; the square wave is available across the CLOCK OUT ports of synthesizer 130. Data input register 131 can handle a serial word of forty one-bit words and can handle a parallel load of five 8-bit words. Data input register 131 sets a 32-bit frequency tuning word in frequency/phase data register 132. This 32-bit frequency tuning word is used in an output tuning resolution of direct digital synthesizer 130.

Figure 7:
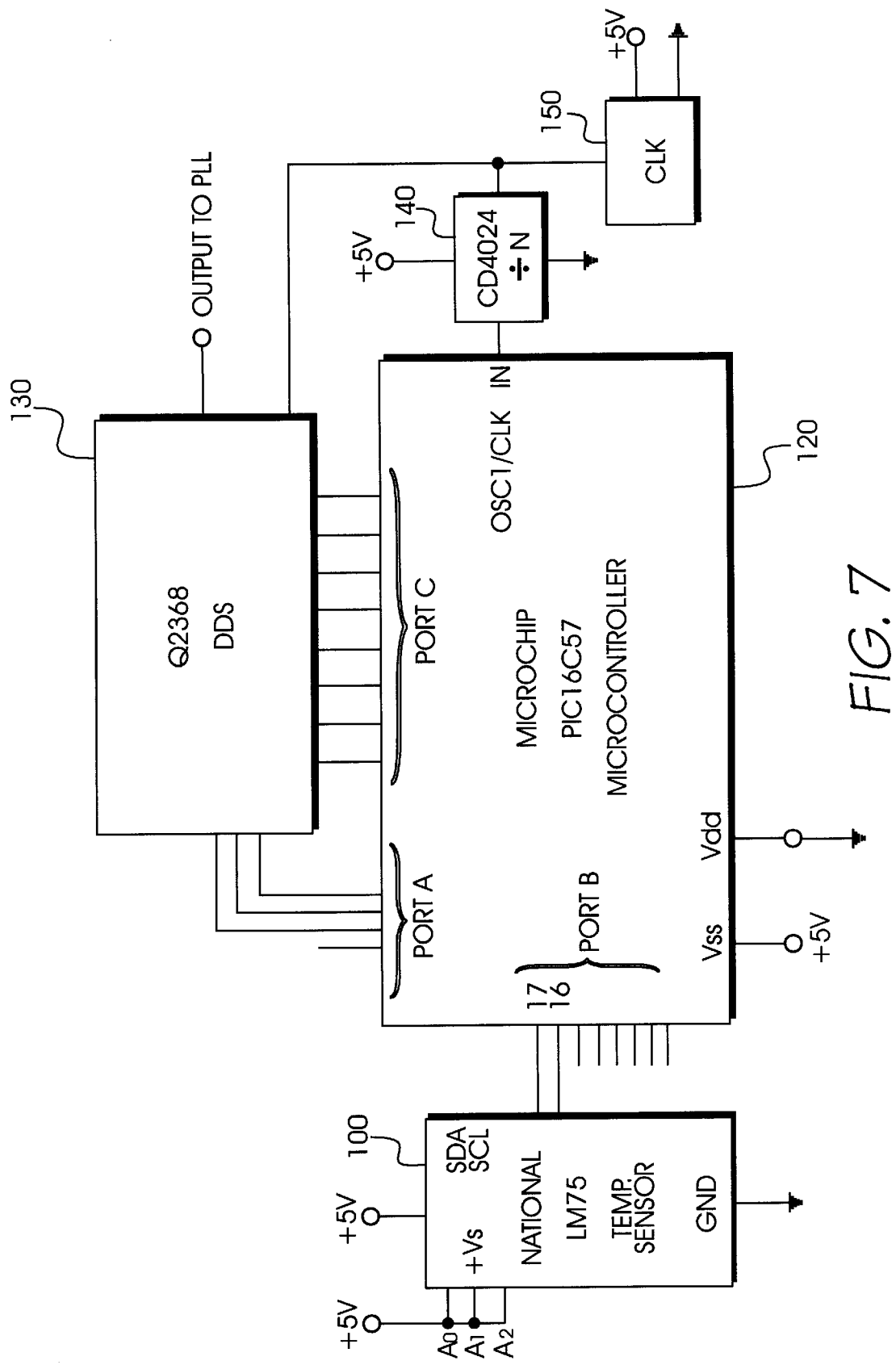
FIG. 7 is a detailed parts diagram depicting a preferred embodiment of the present invention.

As show in FIG. 7, the direct digital synthesizer 130 may be a Q2368 dual direct digital synthesizer, manufactured by Qualconim Incorporated, of San Diego, Calif. A Q2368 can be used as a single high-speed direct digital synthesizer up to 130 Megahertz. Aliased-imaging techniques permit up conversion to even higher frequencies. Further, the pin setting permits selection of modes of operation. This Q2368 has 32-bit resolution for frequency and phase. Other possible models available from Qualcomm Incorporated include the Q2240 direct digital synthesizer, the Q2334 dual direct digital synthesizer, the Q2240 high speed general purpose direct digital synthesizer and the Q2368 high speed dual direct digital synthesizer. The AD9830, AD9831 and AD9850 complete direct digital synthesizers are available from Analog Devices, Inc., of Norwood, Mass.

In addition, direct digital synthesizer chips at 64-bit or 16-bit or other resolution may be used, or direct digital synthesizer chips providing other resolutions.

The above demonstrates that the performance of the present invention is an improvement over contemporary art. The present invention minimizes temperature dependent variations of the frequency signal, $f_{CLK}$, generated by a quartz resonator based frequency source. The preferred embodiment requires less power and stabilizes frequency faster than a typical oven stabilized crystal oscillator. The present invention provides a higher frequency stability than a typical temperature compensated crystal oscillator and provides frequency stability that is comparable to an oven stabilized crystal oscillator. Further, these embodiments are cost-effective. The present invention has significant advantages in design, in manufacturing, and in operation, and offers an effective alternative to precision frequency sources of the contemporary practice (such as OCXOs). Modifications of the foregoing embodiments are possible without departing from the principles of the present invention. For example, it may be noted that although the foregoing embodiments are described as using a sine, or cosine wave table, or algorithm provided by one or more of the commercially available direct digital synthesizers to generate simple, period waves by mapping the wave using a sine wave lookup table, the foregoing embodiments may be used to generate arbitrary waveforms with general waveform mapping by applying the output of the phase accumulator of the synthesizer into an external random memory device or combination of a random memory device and a digital to analog converter. Moreover, more than one table of tuning words may be formed during initialization with each of the tables (or each set of tables) corresponding to a different one of the output frequencies.

What is claimed is:

1. A frequency correction circuit, comprising:
- a clock circuit generating a reference frequency signal exhibiting regular intervals occurring at clock frequencies varying as a function of ambient temperature;
- a temperature sensor producing temperature signals representing contemporary values of said ambient temperature;
- a memory storing a plurality of digital tuning words each indexed in correspondence with different ones of said temperature signals, with each of said digital tuning words representing a value producing a constant selected output frequency when said value is multiplied by a corresponding one of said clock frequencies;
- a control circuit generating control signals and reading said digital tuning words from said memory in dependence upon said temperature signals; and
- a frequency synthesizer having a load clock and a reset function operationally responding to said control signals, said frequency synthesizer generating an output signal exhibiting a second frequency proportional to a product obtained by multiplying said value of said digital tuning word by said corresponding one of said clock frequencies;
- wherein said memory stored said plurality of digital tuning words with each of said digital tuning words being indexed in correspondence with different ones of said temperature signals and being indexed in correspondence with representations of age of said clock circuit.

2. The frequency correction circuit of claim 1, further comprising:
- said frequency synthesizer having an accumulator accommodating a plurality of bits of said digital tuning word, and
- said frequency synthesizer generating said output signal with said second frequency being determined by a ratio between said product and a number in said plurality of bits.

3. A frequency correction circuit, comprising:
- a clock circuit generating a reference frequency signal exhibiting a first frequency;
- a temperature sensor producing temperature signals representing sensed temperatures ambient to said clock circuit;
- a control circuit generating, in correspondence with said temperature signals, frequency instruction signals corresponding to corrections of deviations by a designated oscillation signal from a selected frequency due to changes in said first frequency indicated by said temperature signals, and generating control signals; and
- a direct digital synthesizer operationally driven by said reference frequency signal and said control signals, with said frequency instruction signals applied to modulate said reference frequency signal during generation of said designated oscillation signal exhibiting said selected frequency;
- wherein said control circuit comprises:
  - a discrete memory storing tables of values of said frequency instruction signals indexed by said sensed temperatures and by age of said clock circuit; and
  - a controller synchronized by said reference frequency signal, addressing said memory and reading said values of said frequency instruction signals generating said control signals, and applying said values of said frequency instruction signals to control said generation by said direct digital synthesizer.

4. The frequency correction circuit of claim 3, with said control circuit comprised of:
- a discrete memory storing values of said frequency instruction signals indexed by said sensed temperatures; and
- a controller synchronized by said reference frequency signal, addressing said memory and reading said values of said frequency instruction signals on a basis of said sensed temperatures, generating said control signals and applying said values of said frequency instruction signals read to control said generation by said direct digital synthesizer.

5. The frequency correction circuit of claim 3, with said control circuit comprised of:
- a discrete memory storing values of said frequency instruction signals indexed by said sensed temperatures and indexed by a characteristic of said clock circuit affecting stability of said reference frequency signal; and
- a controller synchronized by said reference frequency signal, addressing said memory and reading said values of said frequency instruction signals on a basis of said sensed temperatures and said characteristic, generating said control signals and applying said values of said frequency instruction signals read to control said generation by said direct digital synthesizer.

6. The frequency correction circuit of claim 3, with said control circuit comprised of
- a microprocessor storing values of said frequency instruction signals indexed by said sensed temperatures, reading said values, and applying said values of said frequency instruction signals to control said generation by said digital synthesizer.

7. The frequency correction circuit of claim 6, comprised of said control circuit initializing said frequency correction circuit by:
- maintaining said clock circuit within an oven at temperatures extending over a temperature range corresponding to an operational limit of said frequency correction circuit;
- driving said direct digital synthesizer to continuously generate said designated oscillating signal albeit with said designated oscillating signal exhibiting output frequencies varying as a function of both said changes in said first frequency and said frequency instruction signals; and
- maintaining said oven at a constant one of each of a plurality of incrementally different temperatures within said temperature range while varying values of said frequency instruction signals, comparing said selected frequency with said output frequencies, and storing within said memory a particular one of said frequency instruction signals indexed by a corresponding one of said constant temperatures when application of said particular one of said frequency instruction signals causes said direct digital synthesizer to generate said designated oscillating signal exhibiting said selected frequency, until a table of said particular ones of said frequency instruction signals indexed by different corresponding ones of said constant temperatures is stored within said memory.

8. The frequency correction circuit of claim 3, with said control circuit comprised of a microprocessor generating said frequency instruction signals by mathematically operating upon said temperature signals.

9. The frequency correction circuit of claim 8, comprised of said control circuit initializing said frequency correction circuit by:
    maintaining said clock circuit within an oven at temperatures extending over a temperature range corresponding to an operational limit of said frequency correction circuit;
    driving said direct digital synthesizer to continuously generate said designated oscillating signal albeit with said designated oscillating signal exhibiting output frequencies varying as a function of both said changes in said first frequency and said frequency instruction signals; and
    maintaining said oven at a constant one of each of a plurality of incrementally different temperatures within said temperature range while varying values of said frequency instruction signals, comparing said selected frequency with said output frequencies, and storing a particular one of said frequency instruction signals indexed by a corresponding one of said constant temperatures when application of said particular one of said frequency instruction signals causes said direct digital synthesizer to generate said designated oscillating signal exhibiting said selected frequency, until a table of said particular ones of said frequency instruction signals indexed by different corresponding ones of said constant temperatures is stored within said microprocessor.

10. A frequency correction circuit, comprising:
    a clock circuit generating a reference frequency signal exhibiting a first frequency;
    a temperature sensor producing temperature signals representing sensed temperatures ambient to said clock circuit;
    a control circuit generating, in correspondence with said temperature signals, frequency instruction signals corresponding to corrections of deviations by a designated oscillation signal from a selected frequency due to changes in said first frequency indicated by said temperature signals, and generating control signals; and
    a direct digital synthesizer operationally driven by said reference frequency signal and said control signals, with said frequency instruction signals applied to modulate said reference frequency signal during generation of said designated oscillation signal exhibiting said selected frequency;
    wherein said control circuit comprises a microprocessor generating said frequency instruction signals by mathematically operating upon said temperature signals and an age of said clock circuit.

11. The frequency correction circuit of claim 10, with said control circuit comprised of a microprocessor storing values of said frequency instruction signals indexed by said sensed temperatures and a physical characteristic of said clock circuit affecting stability of said first frequency, and reading and applying said values of said frequency instruction signals to control said generation by said digital synthesizer.

12. The frequency correction circuit of claim 10, with said control circuit comprised of a microprocessor generating said frequency instruction signals by mathematically operating upon said temperature signals and a physical characteristic of said clock circuit affecting stability of said first frequency.

13. The frequency correction circuit of claim 10, with said control circuit comprised of:
    a discrete memory storing values of said frequency instruction signals indexed by said sensed temperatures and a physical characteristic of said clock circuit affecting stability of said first frequency; and
    a controller synchronized by said reference frequency signal, addressing said memory on a basis of said sensed temperatures and said physical characteristic and reading addressed said values of said frequency instruction signals, generating said control signals and applying said values of said frequency instruction signals to control said generation by said direct digital synthesizer.

14. A frequency correction circuit, comprising:
    a clock circuit generating a reference frequency signal exhibiting a first frequency;
    a temperature sensor producing temperature signals representing sensed temperatures ambient to said clock circuit;
    a control circuit generating, in correspondence with said temperature signals, frequency instruction signals corresponding to corrections of deviations by a designated oscillation signal from a selected frequency due to changes in said first frequency indicated by said temperature signals, and generating control signals; and
    a direct digital synthesizer operationally driven by said reference frequency signal and said control signals, with said frequency instruction signals applied to modulate said reference frequency signal during generation of said designated oscillation signal exhibiting said selected frequency;
    wherein said control circuit comprises a microprocessor storing values of said frequency instruction signals indexed by said sensed temperatures and by an age of said clock circuit, reading and applying said values of said frequency instruction signals to control said generation by said digital synthesizer.

15. A frequency correction circuit, comprising:
    a clock circuit generating a reference frequency signal exhibiting a first frequency;
    a temperature sensor producing temperature signals representing sensed temperatures ambient to said clock circuit;
    a control circuit generating, in correspondence with said temperature signals, frequency instruction signals corresponding to corrections of deviations by a designated oscillation signal from a selected frequency due to changes in said first frequency indicated be said temperature signals, and generating control signals; and
    a direct digital synthesizer operationally driven by said reference frequency signal and said control signals, with said frequency instruction signals applied to modulate said reference frequency signal during generation of said designated oscillation signal exhibiting said selected frequency;
    wherein said control circuit initializes said frequency correction circuit by:
        maintaining said clock circuit within an oven at temperatures extending over a temperature range corresponding to an operational limit of said frequency correction circuit;
        driving said direct digital synthesizer to continuously generate said designated oscillating signal albeit with said designated oscillating signal exhibiting output frequencies varying as a function of both said changes in said first frequency and said frequency instruction signals; and
        maintaining said oven at a constant one of each of a plurality of incrementally different temperatures within said temperature range while varying values of said frequency instruction signals, comparing said selected frequency with said output frequencies, and storing a particular one of said frequency instruction signals indexed by a corresponding one of said constant temperatures when application of said particular one of said frequency instruction signals causes said direct digital synthesizer to generate said designated oscillating signal exhibiting said selected frequency, until a table of said particular ones of said frequency instruction signals indexed by different corresponding ones of said constant temperatures is stored within said control circuit.

16. A frequency correction process, comprising the steps of:
   employing a clock circuit to generate a reference frequency signal exhibiting regular intervals occurring at clock frequencies varying as a function of ambient temperature;
   producing temperature signals representing contemporary values of said ambient temperature;
   storing a plurality of digital tuning words each indexed by a different one of said temperature signals and by an age of said clock circuit, with each of said digital tuning words representing a value producing a constant selected output frequency when said value is multiplied by a corresponding one of said clock frequencies;
   generating control signals and reading said digital tuning words from said memory in dependence upon said temperature signals; and
   operationally responding to said control signals by generating an output signal exhibiting a second frequency proportional to a product obtained by multiplying said value of said digital tuning word by said corresponding one of said clock frequencies.

17. The frequency correction process of claim 16, further comprising the steps of:
   stating said digital tuning word with a plurality of binary bits, and
   generating said output signal with said second frequency being directly proportional to a ratio between said product and a number defined by said plurality of bits.

18. A frequency correction circuit, comprising:
   a clock circuit generating a reference frequency signal exhibiting a first frequency;
   a sensor producing output signals representative of conditions attendant to said clock circuit;
   a control circuit generating, in correspondence with said output signals, digital tuning signals corresponding to corrections of deviations by a periodic signal from a selected frequency due to changes in said first frequency indicated by said output signals, and generating control signals operationally distinct from said digital tuning signals; and
   a direct digital synthesizer operationally driven by said reference frequency signal and said control signals, with said digital tuning signals applied to generation of said periodic signal exhibiting said selected frequency;
   wherein said control circuit generates said control signals by mathematically operating upon said output signals of said sensor and an age of said clock circuit.

19. The frequency correction circuit of claim 18, with said control circuit comprised of:
   a discrete memory storing values of said digital tuning words indexed by said output signals; and
   a controller synchronized by said reference frequency signal, addressing said memory and reading said values of said digital tuning signals, generating said control signals and applying said values of said digital tuning signals to control said generation by said direct digital synthesizer.

20. A frequency correction circuit, comprising:
   a clock circuit generating a reference frequency signal exhibiting a first frequency varying in stability and accuracy in dependence upon conditions attendant to said clock circuit;
   a sensor producing output signals representative of a first one of said conditions;
   a frequency synthesizer generating phase information by digitally dividing said reference frequency with multiple bit tuning words into a plurality of successive changes in phase of said reference frequency, and converting said phase information into periodic signals exhibiting corresponding selected frequencies; and
   a control circuit generating, in correspondence with said output signals, said multiple bit tuning words each corresponding to corrections of different deviations by said periodic signal from said corresponding selected frequencies, said deviations being due to changes in said first one of said conditions indicated by said output signals, and generating control signals operationally distinct from said multiple bit tuning words to functionally influence operation of said frequency synthesizer;
   wherein said control circuit indexes said multiple bit tuning words in accordance with said output signals and an age of said clock circuit.

21. The frequency correction circuit of claim 20, with said control circuit comprised of:
   a discrete memory storing values of said multiple bit tuning words indexed by said output signals; and
   a controller synchronized by said reference frequency signal, addressing said memory on a basis of said output signals and reading said values of said tuning signals, generating said control signals and applying said values of said tuning signals to control said generation by said frequency synthesizer.

22. The frequency correction circuit of claim 20, with said control circuit comprised of:
   a discrete memory storing values of said multiple bit tuning words indexed by said output signals and indexed by said age of said clock circuit; and
   a controller synchronized by said reference frequency signal, addressing said memory on a basis of said output signals and said age, and reading said values of said tuning signals, generating said control signals and applying said values of said tuning signals to control said generation by said frequency synthesizer.

23. The frequency correction circuit of claim 20, with said control circuit comprised of:
   a discrete memory storing values of said multiple bit tuning words indexed by said output signals and indexed by a characteristic of said clock circuit affecting said stability; and
   a controller synchronized by said reference frequency signal, addressing said memory on a basis of said output signals and said characteristic of said clock circuit affecting said stabilit, and reading said values of said tuning signals, generating said control signals and applying said values of said tuning signals to control said generation by said frequency synthesizer.

24. A frequency correction circuit, comprising:
a clock circuit generating a reference frequency signal exhibiting a first frequency varying in stability and accuracy in dependence upon conditions attendant to said clock circuit;
a sensor producing output signals representative of a first one of said conditions;
a frequency synthesizer generating phase information by digitally dividing said reference frequency with multiple bit tuning words into a plurality of successive changes in phase of said reference frequency, and converting said phase information into periodic signals exhibiting corresponding selected frequencies; and
a control circuit generating, in correspondence with said output signals, said multiple bit tuning words each corresponding to corrections of different deviations by said periodic signal from said corresponding selected frequencies, said deviations being due to changes in said first one of said conditions indicated by said output signals, and generating control signals operationally distinct from said multiple bit tuning words to functionally influence operation of said frequency synthesizer;
wherein said control circuit comprises a microprocessor executing an algorithm generating said frequency instruction signals in dependence upon said output signals and an age of said clock circuit.

25. The frequency correction circuit of claim 20, with said control circuit comprised of a microprocessor executing an algorithm generating said frequency instruction signals in dependence upon said output signals and a characteristic of said clock circuit affecting said stability.

26. A frequency correction circuit, comprising:
a clock circuit generating a reference frequency signal exhibiting regular intervals occurring at clock frequencies varying as a function of ambient temperature;
a temperature sensor producing temperature signals representing contemporary values of said ambient temperature;
a memory storing a plurality of sets of digital tuning words with each of said sets of digital tuning words being indexed in correspondence with different representations of age of said clock circuit, and each of said digital tuning words in any set of said plurality of sets being indexed in correspondence with different ones of said temperature signals;
a control circuit generating control signals and reading said digital tuning words from said memory in dependence upon said temperature signals; and
a frequency synthesizer having a load clock and a reset function operationally responding to said control signals, said frequency synthesizer generating an output signal exhibiting a second frequency proportional to a product obtained by multiplying said value of said digital tuning word by said corresponding one of said clock frequencies.

27. The circuit of claim 26, further comprised of each of said digital tuning words representing a value producing a constant selected output frequency when said value is multiplied by a corresponding one of said clock frequencies.

28. The circuit of claim 26, with:
said frequency synchronizer comprising an accumulator accommodating a plurality of bits of said digital tuning word; and
said frequency synchronizer generating said output signal with said second frequency being determined by a ratio between said product and a number in said plurality of bits.

29. A frequency correction circuit, comprising:
a clock circuit generating a reference frequency signal exhibiting regular intervals occurring at clock frequencies varying as a function of ambient temperature;
a memory storing a plurality of sets of equations providing digital tuning words in response to indications of age of said clock circuit;
a control circuit generating control signals and reading said digital tuning words from said memory in dependence upon said indications of age; and
a frequency synthesizer having a load clock and a reset function operationally responding to said control signals, said frequency synthesizer generating an output signal exhibiting a second frequency proportional to a product obtained by multiplying said value of said digital tuning word by said corresponding one of said clock frequencies.

30. The circuit of claim 29, further comprised of each of said digital tuning words representing a value producing a constant selected output frequency when said value is multiplied by a corresponding one of said clock frequencies.

31. The circuit of claim 29, with:
said frequency synchronizer comprising an accumulator accommodating a plurality of bits of said digital tuning word; and
said frequency synchronizer generating said output signal with said second frequency being determined by a ratio between said product and a number in said plurality of bits.

32. A frequency correction circuit, comprising:
a clock circuit generating a reference frequency signal exhibiting regular intervals occurring at clock frequencies varying as a function of ambient temperature;
a memory storing a plurality of sets of equations providing digital tuning words in response to indications of age of said clock circuit;
a control circuit generating control signals and reading said digital tuning words from said memory in dependence upon said indications of age; and
a frequency synthesizer having a load clock and a reset function operationally responding to said control signals, said frequency synthesizer generating an output signal exhibiting a second frequency proportional to said value of said digital tuning word and to said corresponding one of said clock frequencies.

33. The circuit of claim 32, further comprised of each of said digital tuning words representing a value producing a constant selected output frequency when said value is multiplied by a corresponding one of said clock frequencies.

34. The circuit of claim 32, with:
said frequency synchronizer comprising an accumulator accommodating a plurality of bits of said digital tuning word; and
said frequency synchronizer generating said output signal with said second frequency being determined by a ratio between said product and a number in said plurality of bits.

35. The circuit of claim 32, further comprised of:
each of said digital tuning words representing a value producing a constant selected output frequency when said value is multiplied by a corresponding one of said clock frequencies;
said frequency synchronizer comprising an accumulator accommodating a plurality of bits of said digital tuning word; and said frequency synchronizer generating said output signal with said second frequency being determined by a ratio between said product and a number in said plurality of bits.

36. A frequency correction circuit, comprising:
a clock circuit generating a reference frequency signal exhibiting regular intervals occurring at clock frequencies varying as a function of ambient temperature;
a temperature sensor producing temperature signals representing contemporary values of said ambient temperature;
a memory storing a plurality of digital tuning words each indexed in correspondence with different ones of said temperature signals and each indexed according to ages of said clock circuit, with each of said digital tuning words representing a value producing a corresponding selected output frequency;
a control circuit generating control signals and reading said digital tuning words from said memory in dependence upon said temperature signals; and
a frequency synthesizer comprising a load clock and a reset function, operationally responding to said control signals by generating an output signal exhibiting a second frequency in dependence upon said value of said tuning word and a corresponding one of said clock frequencies.

37. The frequency correction circuit of claim 36, further comprising:
said frequency synthesizer having an accumulator accommodating a plurality of bits of said digital tuning word, and
said frequency synthesizer generated said output signal with said second frequency being determined by a ratio between said product and a number in said plurality of bits.

38. The circuit of claim 36, further comprised of:
each of said digital tuning words representing a value producing a constant selected output frequency when said value is multiplied by a corresponding one of said clock frequencies;
said frequency synchronizer comprising an accumulated accommodating a plurality of bits of said digital tuning word; and
said frequency synchronizer generating said output signal with said second frequency being determined by a ratio between said product and a number in said plurality of bits.

39. A frequency correction circuit, comprising:
a clock circuit generating a frequency signal exhibiting regular intervals occurring at clock frequencies varying as a function of ambient temperature;
a temperature sensor producing temperature signals representing contemporary values of said ambient temperature;
a memory storing a plurality of algorithms each representing a plurality of digital tuning words each corresponding to different ones of said temperature signals and each indexed according to non-thermal parameters affecting accuracy of said clock circuit, with each of said digital tuning words representing a value producing a corresponding selected output frequency;
a control circuit generating control signals and reading said digital tuning words from said memory in dependence upon said temperature signals; and
a frequency synthesizer comprising a load clock and a reset function, operationally responding to said control signals by generating an output signal exhibiting a second frequency in dependence upon said value of said tuning work and a corresponding one of said clock frequencies.

40. The frequency correction circuit of claim 39, further comprising:
said frequency synthesizer having an accumulator accommodating a plurality of bits of said digital tuning word, and
said frequency synthesizer generating said output signal with said second frequency being determined by a ratio between said product and a number in said plurality of bits.

41. The circuit of claim 39, further comprised of:
each of said digital tuning words representing a value producing a constant selected output frequency when said value is multiplied by a corresponding one of said clock frequencies;
said frequency synchronizer comprising an accumulator accommodating a plurality of bits of said digital tuning word; and
said frequency synchronizer generating said output signal with said second frequency being determined by a ratio between said product and a number in said plurality of bits.

42. The circuit of claim 39, further comprised of said equations representing reversals of direction in deviation of said clock frequencies.

43. The circuit of claim 39, further comprised of said non-thermal parameters being selected from the group of aging of said clock circuit, acceleration forces experienced by said clock circuit.

44. A frequency correction process, comprising:
generating with a clock circuit a reference frequency signal exhibiting a first frequency;
producing output si representative of conditions attendant to said clock circuit;
generating, in correspondence with said output signals, digital tuning signals corresponding to corrections of deviations by a periodic signal from a selected frequency due to changes in said first frequency indicated by said output signals, and generating control signals operationally distinct from said digital tuning signals;
driving a direct digital synthesizer with said reference frequency signal and said control signals, and applying said digital tuning signals to generate said periodic signal exhibiting said selected frequency;
generating said control signals by mathematically operating upon said output signals as a function of an age of said clock circuit.

45. The frequency correction process of claim 44, further comprising of:
storing values of said digital tuning words indexed by said output signals; and
addressing said values of said digital tuning works in synchronism with said reference frequency signal and reading said values of said digital tuning signals; and
applying said values of said digital tuning signals to control said generation of said periodic signal exhibiting said selected frequency.

* * * * *